(12) United States Patent
Plecko

(10) Patent No.: US 12,557,252 B2
(45) Date of Patent: Feb. 17, 2026

(54) SYSTEMS AND METHODS FOR THERMAL MANAGEMENT IN UTILITY SCALE POWER INVERTERS

(71) Applicant: SCHNEIDER ELECTRIC SOLAR INVERTERS USA, INC., Livermore, CA (US)

(72) Inventor: David Plecko, North Vancouver (CA)

(73) Assignee: SCHNEIDER ELECTRIC SOLAR INVERTERS USA, INC., Livermore, CA (US)

( * ) Notice: Subject to any disclaimer, the term of this patent is extended or adjusted under 35 U.S.C. 154(b) by 11 days.

(21) Appl. No.: 17/662,855

(22) Filed: May 11, 2022

(65) Prior Publication Data

US 2022/0272879 A1 Aug. 25, 2022

Related U.S. Application Data

(63) Continuation of application No. 16/311,580, filed as application No. PCT/US2017/038104 on Jun. 19, 2017, now Pat. No. 11,382,242.
(Continued)

(51) Int. Cl.
*H05K 7/20* (2006.01)
*H01L 23/473* (2006.01)
(Continued)

(52) U.S. Cl.
CPC ....... *H05K 7/20927* (2013.01); *H05K 7/2059* (2013.01); *H05K 7/20909* (2013.01);
(Continued)

(58) Field of Classification Search
CPC .......... H05K 7/20218–20281; H05K 7/20609; H05K 7/207; H05K 7/20927;
(Continued)

(56) References Cited

U.S. PATENT DOCUMENTS

| | | |
|---|---|---|
| 5,285,347 A | 2/1994 | Fox et al. |
| 5,884,486 A | 3/1999 | Hughes et al. |

(Continued)

FOREIGN PATENT DOCUMENTS

| | | |
|---|---|---|
| WO | 2012152275 A2 | 11/2012 |
| WO | 2016054666 A1 | 4/2016 |

OTHER PUBLICATIONS

Notification of Transmittal of the International Search Report and the Written Opinion of the International Searching Authority from corresponding PCT/US2017/038104 dated Sep. 1, 2017.
(Continued)

*Primary Examiner* — Zachary Pape
(74) *Attorney, Agent, or Firm* — Kinney & Lange, P.A.

(57) ABSTRACT

A power electronics system comprising a environmentally sealed electronics compartment for housing power electronics equipment is provided. The system includes a plenum within the sealed electronic compartment for circulating air. A first liquid cooling loop is configured to cool air flowing through the plenum. A second liquid cooling loop configured to directly cool the power electronics equipment. The system includes a controller configured to independently control the flow rate of the first liquid cooling loop and the second liquid cooling loop.

23 Claims, 13 Drawing Sheets

Related U.S. Application Data

(60) Provisional application No. 62/352,431, filed on Jun. 20, 2016.

(51) Int. Cl.
*H02S 40/34* (2014.01)
*H02S 40/42* (2014.01)

(52) U.S. Cl.
CPC ............ *H01L 23/473* (2013.01); *H02S 40/345* (2014.12); *H02S 40/425* (2014.12); *H05K 7/20254* (2013.01); *H05K 7/20281* (2013.01); *H05K 7/207* (2013.01); *H05K 7/20945* (2013.01)

(58) Field of Classification Search
CPC . H05K 7/20945; H01L 23/473; H02S 40/345; H02S 40/40–425; Y02E 10/76
See application file for complete search history.

(56) References Cited

U.S. PATENT DOCUMENTS

| | | | |
|---|---|---|---|
| 7,178,354 B2 | 2/2007 | Bretschneider et al. | |
| 7,486,513 B2* | 2/2009 | Hall | G06F 1/20 165/80.4 |
| 7,511,959 B2 | 3/2009 | Belady et al. | |
| 7,963,119 B2 | 6/2011 | Campbell et al. | |
| 8,482,163 B2 | 7/2013 | Belikoff et al. | |
| 9,140,479 B2* | 9/2015 | Gomes | F25D 11/02 |
| 9,420,732 B2 | 8/2016 | Desai et al. | |
| 9,927,165 B2 | 3/2018 | Sutherland et al. | |
| 11,382,242 B2* | 7/2022 | Plecko | H05K 7/20927 |
| 2003/0010041 A1 | 1/2003 | Wessling et al. | |
| 2006/0102322 A1* | 5/2006 | Madara | H05K 7/20736 165/104.21 |
| 2007/0002536 A1 | 1/2007 | Hall et al. | |
| 2007/0091571 A1* | 4/2007 | Malone | H05K 7/20772 361/699 |
| 2012/0201005 A1 | 8/2012 | Barringer et al. | |
| 2012/0253571 A1 | 10/2012 | Yun et al. | |
| 2012/0279567 A1 | 11/2012 | Alexander | |
| 2013/0068423 A1 | 3/2013 | Campbell et al. | |
| 2013/0128918 A1* | 5/2013 | Campbell | H05K 7/20836 374/57 |
| 2013/0249460 A1 | 9/2013 | Sugahara | |
| 2014/0011437 A1* | 1/2014 | Gosselin | H05K 7/20836 454/154 |
| 2014/0211531 A1* | 7/2014 | Yamashita | B61C 3/00 363/141 |
| 2014/0262177 A1 | 9/2014 | Tang et al. | |
| 2015/0138729 A1* | 5/2015 | Desai | H02M 7/003 361/699 |
| 2015/0323784 A1 | 11/2015 | Chamuczynski | |
| 2016/0353612 A1 | 12/2016 | Lee et al. | |

OTHER PUBLICATIONS

Extended European Search Report from corresponding European Application No. 17815996.8 dated Jan. 3, 2020.

\* cited by examiner

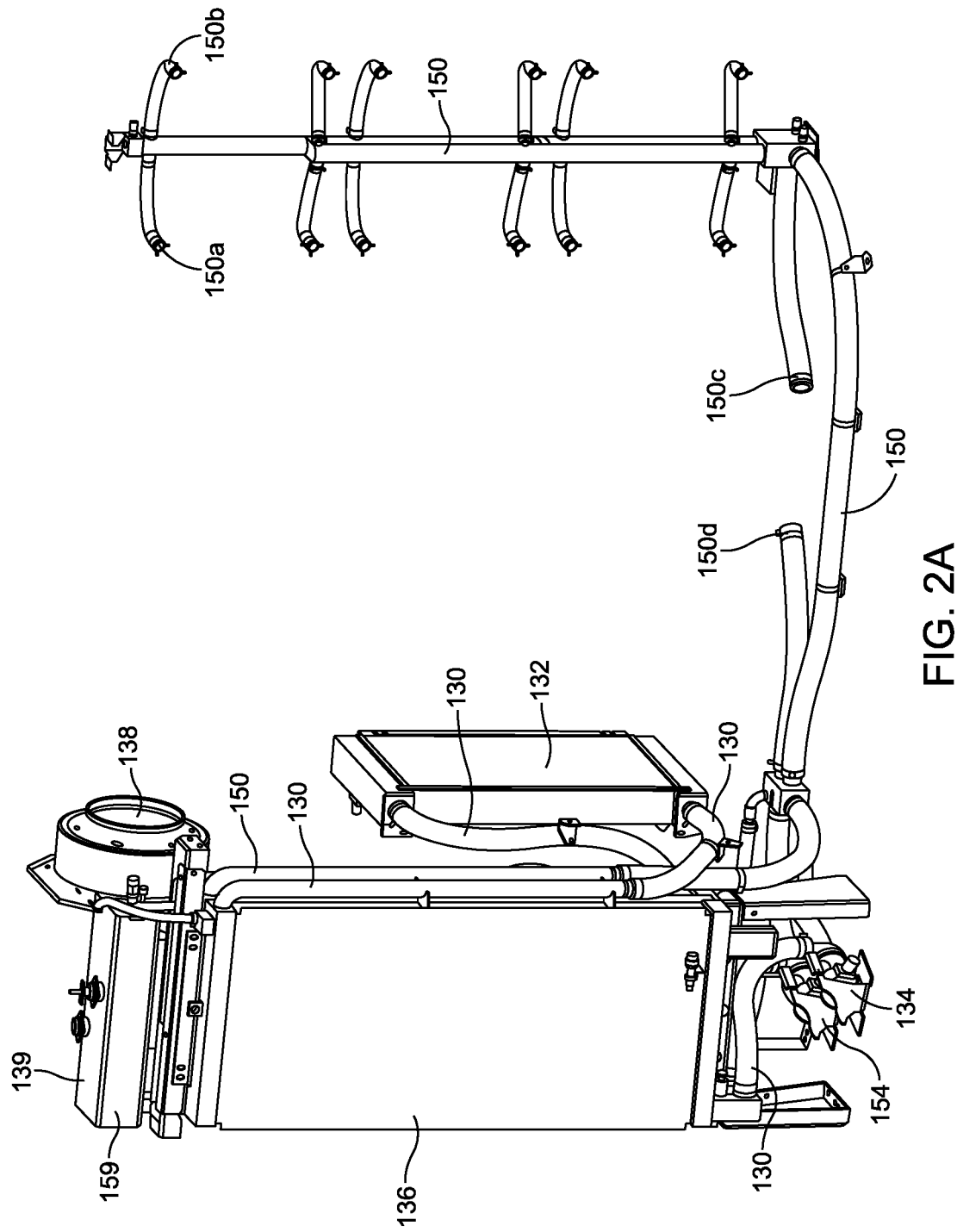

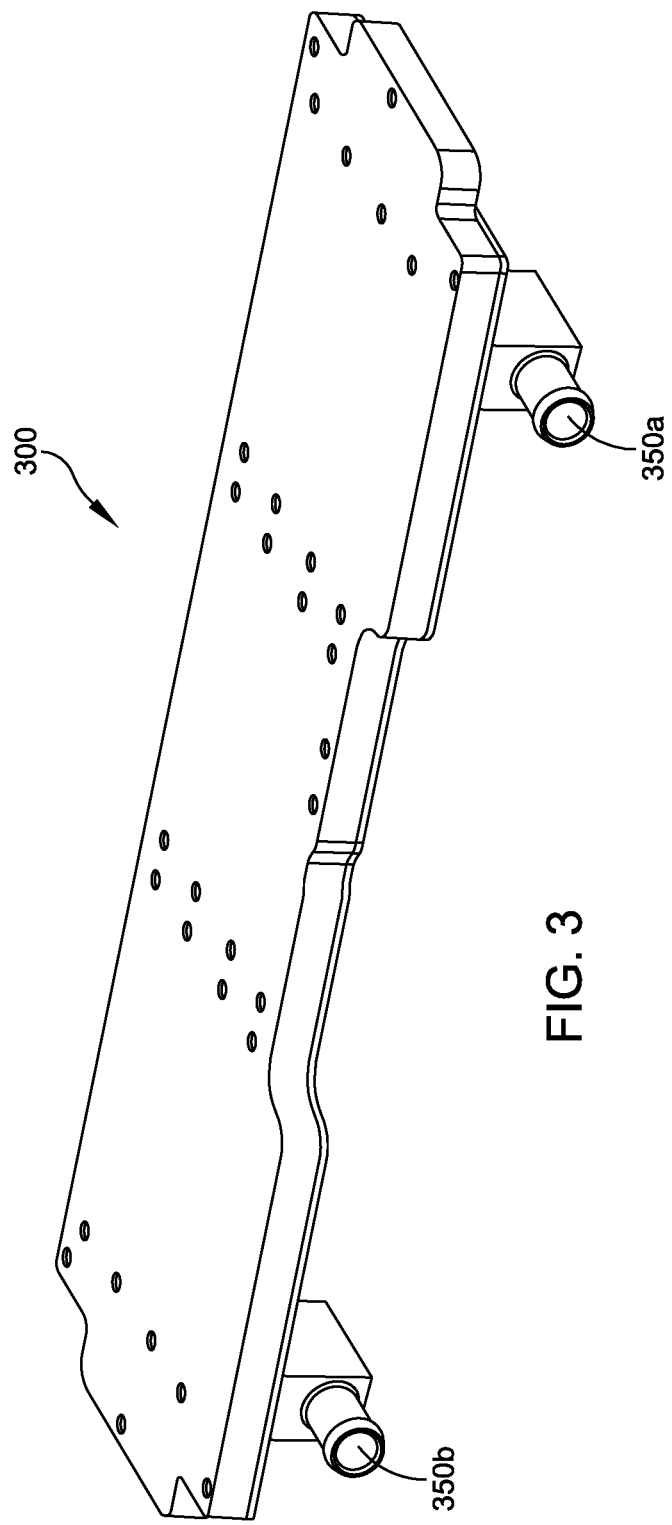

SYSTEMS AND METHODS FOR THERMAL MANAGEMENT IN UTILITY SCALE POWER INVERTERS

RELATED APPLICATIONS

This application is a Continuation of U.S. application Ser. No. 16/311,580, filed Dec. 19, 2018, titled SYSTEMS AND METHODS FOR THERMAL MANAGEMENT IN UTILITY SCALE POWER INVERTERS, which is a U.S. National Stage Application under 35 U.S.C. § 371 of International Application No. PCT/US2017/038104, filed Jun. 19, 2017, titled SYSTEMS AND METHODS FOR THERMAL MANAGEMENT IN UTILITY SCALE POWER INVERTERS, which claims the benefit under 35 U.S.C. § 119(e) of U.S. Provisional Application No. 62/352,431, filed Jun. 20, 2016, titled SYSTEMS AND METHODS FOR THERMAL MANAGEMENT IN UTILITY SCALE POWER INVERTERS, both of which are hereby incorporated by reference in their entirety for all purposes.

This application relates to U.S. Patent Application Ser. No. 62/352,406, filed Jun. 20, 2016, titled SYSTEMS AND METHODS FOR HUMIDITY CONTROL IN UTILITY SCALE POWER INVERTERS, which is incorporated by reference in its entirety for all purposes.

BACKGROUND

Field of Invention

Embodiments of the present invention relate generally to utility scale power inverter's enclosures.

Discussion of Related Art

A power inverter, or t is an electronic device or circuitry that converts direct current (DC) to alternating current (AC). Inverters may be used in a number of different contexts, with different DC power sources (such as lead acid batteries, photovoltaic solar panels, wind turbines, etc.), and may be designed to satisfy different power demands of a system.

Utility scale solar inverters, in particular, convert variable DC output of a photovoltaic (PV) solar panel into a utility frequency AC to provide power to either a commercial electrical grid or a local, off-grid electrical network. Solar inverters are connected to a plurality of photovoltaic cells that provide DC input to the inverter. The inverter comprises at least one DC-to-AC power conversion bridge, associated filter electronics and an AC (output) module. The DC-to-AC power conversion bridge uses a plurality of electronic switches, typically insulated gate bipolar transistors (IGBTs), and diodes to convert the DC input into AC output. For grid-connected inverters providing power to an electricity grid, the AC output is filtered to provide an AC output waveform that is suitable for the grid. Furthermore, solar power inverters have special functions adapted for use with photovoltaic arrays, including maximum power point tracking and anti-islanding protection.

During operation, various components of a solar inverter (including the power conversion bridges and filter electronics/magnetics) generate significant heat and typically require cooling. For low power solar inverters, providing cooling airflow around heat-producing components of the inverter module is often sufficient. Air-cooling (using fans, blowers, radiators etc.) has also been used for thermal management in conventional high power (>1 MW) solar inverters where the enclosure is vented (open to the surroundings). However, high power solar inverters generally require more sophisticated cooling, and are sometimes liquid-cooled. Additionally, the power density requirements for solar inverters have continued to increase such that traditional air-cooling is not well suited to the heat extraction requirements.

The liquid coolant loop in high power solar inverters is sometimes part of a larger cooling system used for other purposes. For high power solar inverters, such an approach can be inadequate to reliably remove the heat generated. Moreover, the integration of a solar inverter into a larger multi-system cooling system on-site is a skilled task and makes the installation and maintenance of such solar inverters expensive.

Some approaches have described a liquid-cooled solar inverter in which liquid coolant is pumped around elements of the solar inverter, in a single loop, in order to cool elements of the DC module, the inverter module, and/or the AC module. The liquid coolant may be directed to a heat exchanger in which the liquid coolant is air cooled.

Solar inverters need to be able to operate in harsh environments (sandy, dusty, hot, cold, sea-side, varied weather conditions etc.) and have a long lifetime requirement (e.g., 30 years) with high uptime requirements. The thermal management system is preferably robust and reliable and in order to thermally regulate and protect the expensive and complex equipment in the solar inverter. Furthermore, the thermal management system is preferably compact, efficient to operate and is preferably easy to install and maintain.

SUMMARY

In at least one embodiment in accordance with principles of the present invention, a power electronics system comprising an environmentally sealed electronics compartment for housing power equipment is provided. The system includes a plenum within the sealed electronic compartment for circulating air. A first liquid cooling loop is configured to cool air flowing through the plenum. A second liquid cooling loop configured to directly cool the power electronics equipment. The system includes a controller configured to independently control the airflow rates and the coolant flow rates of the first liquid cooling loop and the second liquid cooling loop.

The power electronics equipment of the system may include an inverter. The internal environmental sensor and the external environmental sensor may be temperature sensors for obtaining temperature information within the sealed electronics compartment and outside the compartment, respectively. In some embodiments, the first liquid cooling loop includes a plurality of heat exchangers and a fan for circulating air through the plenum. In addition, the second liquid cooling loop may include a thermal plate. In other embodiments, the controller may be programmed to analyze environmental data to control the flow rate of the liquid cooling loops and the airflow to maintain a pre-set temperature within the sealed electronics compartment.

One aspect of the disclosure is directed to a power electronics system comprising an environmentally sealed electronics compartment for housing power electronics equipment, a plenum within the sealed electronics compartment for circulating air, a first liquid cooling loop configured to cool air flowing through the plenum, a second liquid cooling loop configured to directly cool the power electronics equipment, and a controller for independently controlling airflow rates and coolant flow rates of the first liquid cooling loop and the second liquid cooling loop.

Embodiments of the system further may include the power electronics equipment embodying an inverter. The power electronics equipment may include an inverter. The first liquid cooling loop may include a plurality of heat exchangers and at least one fan for circulating air through the plenum. The controller may be programmed to analyze environmental data to control air and coolant flow rates of the first and second liquid cooling loops to maintain a pre-set temperature within the sealed electronics compartment. The first liquid cooling loop may include a first heat exchanger, a second heat exchanger, and a pump to circulate a liquid coolant in the first liquid cooling loop. The system further may include a fan to circulate air within the sealed electronics compartment, the fan being configured to draw air through the duct and blowing air through the first heat exchanger. The system further may include at least one fan to draw air from outside across the second heat exchanger to reduce a temperature of liquid coolant passing through the second heat exchanger. The first liquid cooling loop may include a first heat exchanger and the second liquid cooling loop may include a second heat exchanger, the system further comprising at least one fan configured to draw air across the first heat exchanger and the second heat exchanger. The plenum may be configured to direct air across an upper portion or ceiling of the sealed electronics compartment and down an interior side wall of the sealed electronics compartment. The second liquid cooling loop may include a heat exchanger and a pump to circulate liquid coolant in the second liquid cooling loop. The second liquid cooling loop may be configured to direct coolant through the power electronics equipment or through a device associated with the power electronics equipment. Coolant in the second liquid cooling loop may be configured to flow through channels inside a thermal plate to which a power conversion bridge is mounted. Coolant in the second liquid cooling loop further may be configured to flow through multiple thermal plates in contact with filter electronics and associated magnetic components. Coolant in the second liquid cooling loop may be configured to flow adjacent to or with electronic switches. The controller may be configured to receive environmental data from environmental sensors to control the operation the first liquid cooling loop and the second liquid cooling loop.

Another aspect of the disclosure is directed to a method of thermal control in a power electronics system. In one embodiment, the method comprises: controlling the flow rate of a first liquid cooling loop within a plenum of a sealed electronics compartment for housing power electronics equipment; and controlling the flow rate of a second liquid cooling loop configured to directly cool the power electronics equipment within the sealed electronics compartment.

Embodiments of the method further may include circulating air through a plenum provided within the sealed electronics compartment. The method further may include circulating air through a plenum provided within the sealed electronics compartment. The method further may include circulating air within the sealed electronics compartment, drawing air through the plenum, and blowing air through a heat exchanger. The first liquid cooling loop may include a plurality of heat exchangers and at least one fan for circulating air through the plenum. The method further may include drawing air from outside the sealed electronics compartment, and directing air across a heat exchanger to reduce a temperature of liquid coolant passing through the heat exchanger. The method further may include analyzing environmental data, and controlling flow rates of the first and second liquid cooling loops to maintain a pre-set temperature within the sealed electronics compartment. The second liquid cooling loop may be configured to direct coolant through the power electronics equipment or through a device associated with the power electronics equipment. Coolant in the second liquid cooling loop may be configured to flow through channels inside a thermal plate to which a power conversion bridge is mounted. Coolant in the second liquid cooling loop further may be configured to flow through multiple thermal plates in contact with filter electronics and associated magnetic components. Coolant in the second liquid cooling loop may be configured to flow adjacent to or with electronic switches.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 2A is an isometric view of an embodiment of a portion of a dual loop liquid cooling system in accordance with principles of the invention;

FIG. 3 is an isometric view of an embodiment of a thermal plate that may be used in accordance with principles of the invention;

DETAILED DESCRIPTION

Unlike in conventional inverters, embodiments of the present invention include a substantially sealed compartment within the utility scale inverter enclosure that houses the electronics (e.g., power conversion bridge and filter electronics etc.). The sealed compartment is designed to block contaminants such as particulates and prevent ingress of liquid water.

To maintain the sealed compartment, as well as meet to the power density requirements, a liquid cooling system is used to maintain the electronic components, circuitry and air temperature within the sealed compartment within a desired temperature range.

Figure 1:
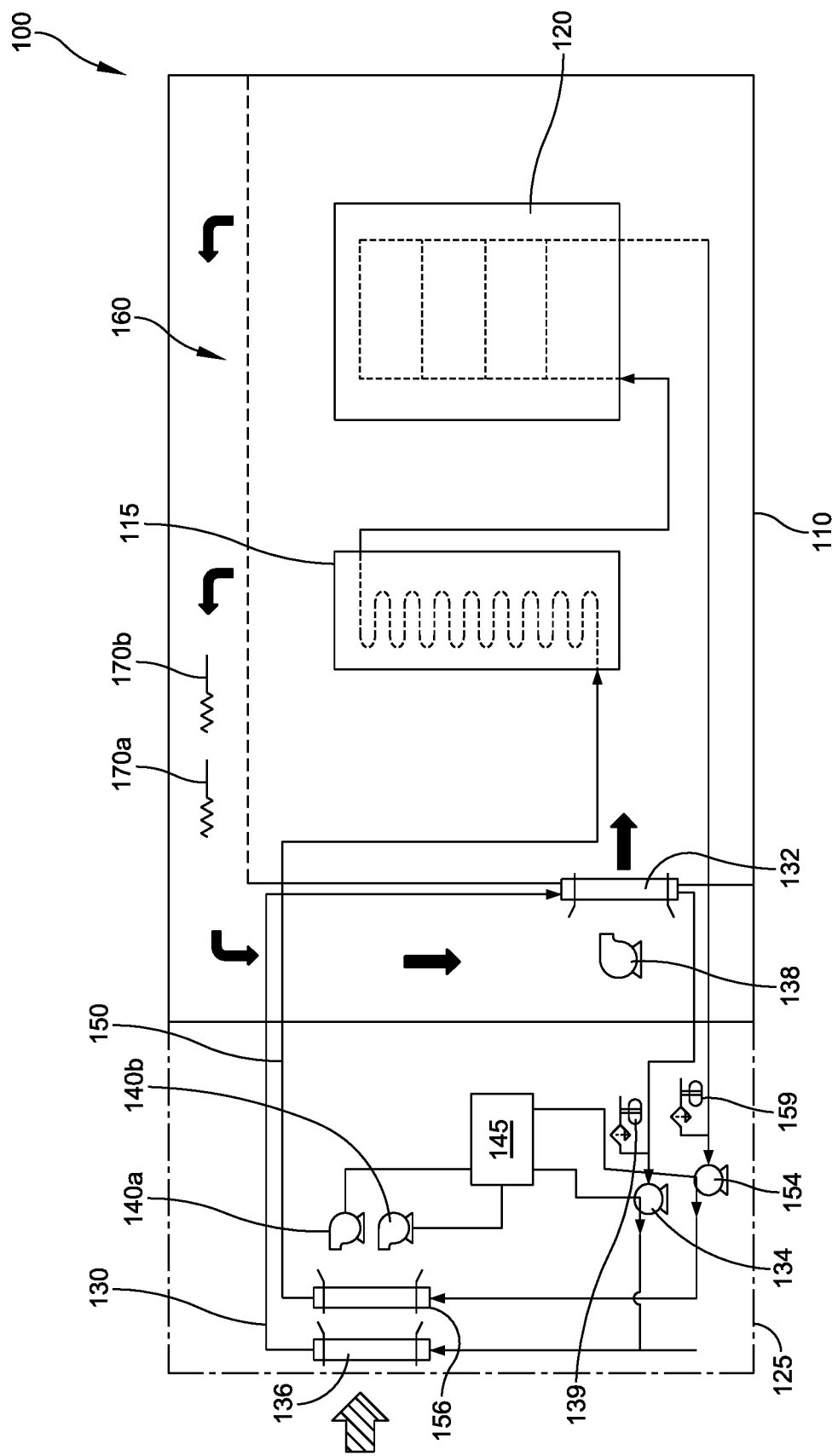
FIG. 1 is a schematic diagram of a power equipment enclosure with a cooling system in accordance with principles of the invention.

FIG. 1 shows a simplified schematic diagram of a solar inverter system 100 comprising a dual-loop liquid cooling system. Solar inverter system 100 comprises sealed electronics compartment 110, which houses various components that generate heat during operation of the solar inverter, including DC-to-AC power conversion bridge(s) 115 and filter electronics 120. Solar inverter system 100 further comprises vented cooling cabinet 125, which houses various components of the liquid cooling system. The liquid coolant is a glycol-based coolant (ethylene glycol), although other suitable liquid coolants can be used.

The cooling system includes two heat exchange loops 130 and 150. First heat exchange loop 130 cools the air within sealed electronics compartment 110, and comprises two heat exchangers 132 and 136, and a pump 134 for circulating a liquid coolant in first heat exchange loop 130. A fan 138 circulates air within sealed electronics compartment 110, drawing it through a duct 160 formed within compartment 110 and blowing it through air to liquid heat exchanger 132 (airflow within the compartment is indicated by the black arrows), so that heat is transferred to the liquid coolant in loop 130 via heat exchanger 132. Duct 160, which may be referred to as a plenum, directs the airflow across the upper portion or ceiling of compartment 110 and down one interior side wall of the compartment. Liquid coolant in loop 130 is then directed through liquid to air heat exchanger 136, which is mounted in an external wall of cooling cabinet 125. Air from outside is drawn through heat exchanger 136 by a pair of fans 140a and 140b (as indicated by the shaded arrow) and reduces the temperature of liquid coolant passing through heat exchanger 136. The first heat exchange loop 130 is configured to have relatively low grade heat, which is the temperature differential between coolant in the first heat exchange loop 130 and ambient air, e.g., 60° C. for coolant and 50° C. for ambient air.

Second loop 150 directly cools power electronics and magnetic components (including DC-to-AC power conversion bridge(s) 115 and filter electronics 120) inside sealed cabinet 110. Second loop 150 comprises a pump 154 for circulating a liquid coolant in second heat exchange loop 150, and a liquid to air heat exchanger 156. Coolant in loop 150 is directed though one or more serpentine channels inside a thermal plate to which each phase of DC to AC power conversion bridge 115 is mounted, and then through multiple thermal plates (in parallel) which are in contact with filter electronics 120 and associated magnetic components. Heat is transferred from components 115 and 120 (and optionally from other heat generating components in compartment 110) to the liquid coolant in loop 150, which is then directed through liquid to air heat exchanger 156. Air from outside is also drawn through heat exchanger 156 by fans 140a and 140b (as indicated by the shaded arrow) and reduces the temperature of liquid coolant passing through heat exchanger 156. The second heat exchange loop 150 is configured to have relatively high-grade heat, which is the temperature differential between coolant in the first heat exchange loop 150 and ambient air, e.g., 80° C. for coolant and 50° C. for ambient air.

Controller 145 receives environmental data from environmental sensors (not shown here) to control the operation of fans 140a and 140b, as well as pump 134 and pump 154 to regulate the temperature in the system. The controller 145 may also be configured to control the operation of the electronic devices within the cabinet 110. The controller is configured to independently control airflow rates and coolant flow rates of the first liquid cooling loop 130 and the second liquid cooling loop 150.

Coolant loops 130 and 150 are fluidly connected to coolant reservoirs 139 and 159, respectively. Sealed liquid pass-throughs into the electronics compartment 110 are used. A pair of heaters 170a and 170b are positioned in duct 160 and are used primarily to raise the temperature inside compartment 110 during start-up of solar inverter system 100 (for example, to mitigate the risk of condensation occurring).

The temperature of the power electronics (and the associated heat rejection requirement) is typically much higher than for the air circulating in compartment 110. In other words cooling loop 150 will tend to run hotter (and have a higher temperature differential or "delta T" relative to the outside temperature) than cooling loop 130. The higher the delta T, the more heat that can be rejected for the same heat exchanger setup and size ($q = h \cdot \Delta T$).

In some implementations, coolant loop 150 (for the power electronics) reaches temperatures exceeding 75° C., whereas loop 130 (for the air in compartment 110) reaches temperatures of only around 60° C.

The utilization of two separate cooling loops—one to cool the air in the electronics compartment, and the other to cool the power electronics/magnetics—enables cost efficient and energy efficient cooling in the solar inverter system and provides excellent thermal management of the power electronics. The coolant flow rate can be different in the two loops, to provide independent control of the delta Ts.

External heat exchangers 136 and 156 are preferably arranged in a stacked configuration and share the same pair of fans 140a and 140b, as shown in FIG. 1. This essentially doubles the airflow through the heat exchangers (relative to having one fan for each heat exchanger) and enhances the performance/cost trade-off. Because cooling loop 130 is running at a lower temperature, heat exchanger 136 is positioned so that incoming cooling air passes through it first, and then through heat exchanger 156 which is stacked behind it. This configuration increases or maximizes the delta T for loop 130, and still provides a satisfactory delta T for cooling loop 150 at heat exchanger 156.

Figure 2B:
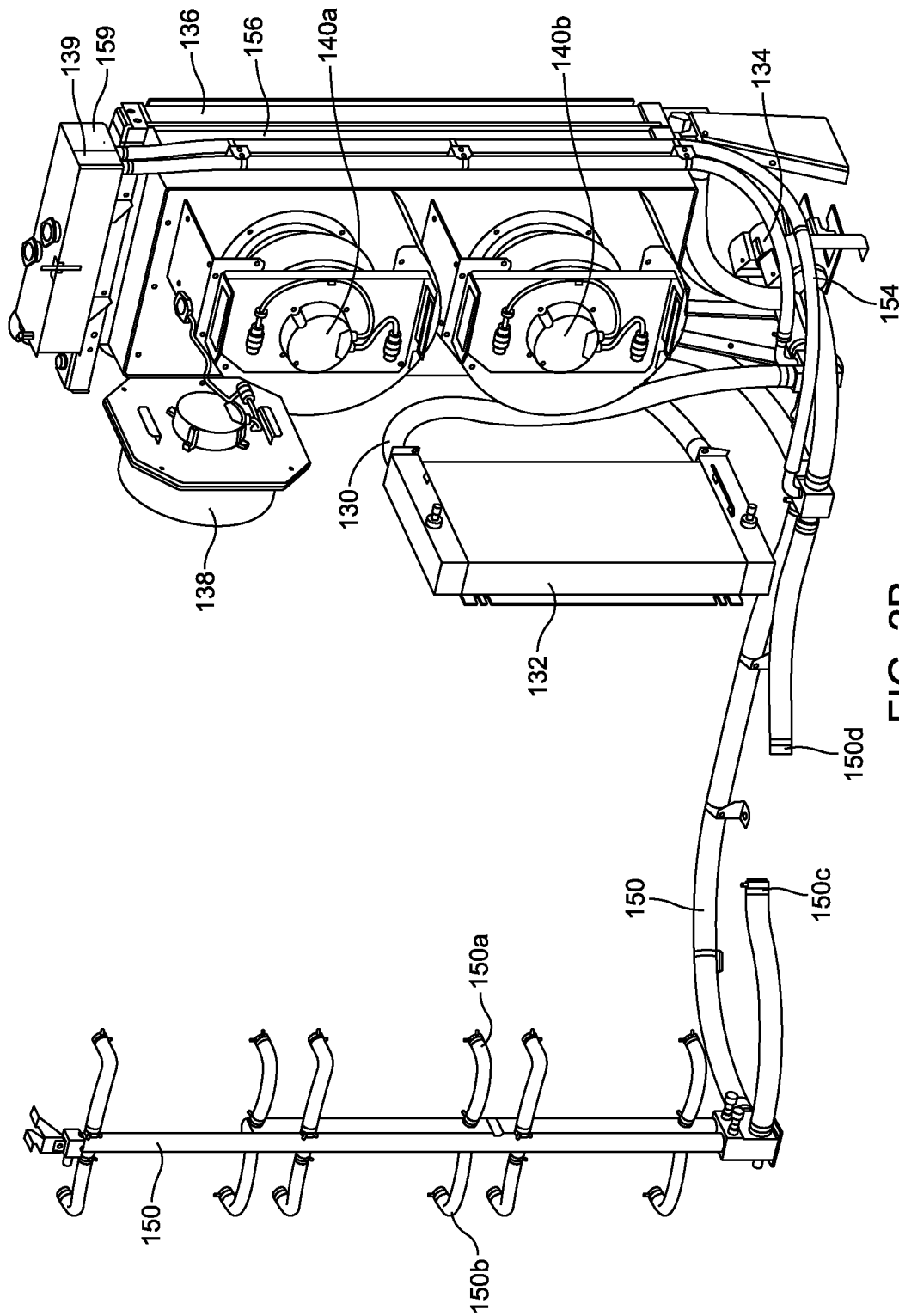
FIG. 2B is a second isometric view of an embodiment of a portion of a dual loop liquid cooling system in accordance with principles of the invention.

FIGS. 2A and 2B are two different isometric views of an embodiment a portion of a dual-loop liquid cooling system for installation in a solar inverter system. The same reference numerals as were used in FIG. 1 are used in FIGS. 2A and 2B to identify like components.

First cooling loop 130 is connected to coolant pump 134, and to heat exchanger 132, for cooling air that is circulated in a sealed electronics compartment by fan 138. Coolant in cooling loop 130 is also directed through heat exchanger 136 where it is cooled by external air drawn though heat exchanger 136 by fans 140a and 140b. Second cooling loop 150 is connected to coolant pump 154. Coolant pump 154 directs coolant in a parallel through six thermal plates (such as shown in FIG. 3). Each thermal plate can be used to cool one phase of a power conversion bridge. Each thermal plate is fluidly connected to coolant loop 150 at an inlet pipe 150a and an outlet pipe 150b. Coolant is then directed in parallel through multiple thermal plates (not shown in FIGS. 2A and 2B) for cooling AC filter electronics (not shown in FIGS. 2A and 2B) via inlet and outlet connections 150c and 150d, respectively in loop 150. The coolant is directed through heat exchanger 156, which is stacked between heat exchanger 136 and fans 140a and 140b. Coolant in loop 150 is cooled by external air that is drawn though heat exchanger 156 by fans 140*a* and 140*b* (after passing through heat exchanger 136).

FIG. 3 is an isometric view of an embodiment of a thermal plate 300 which can be fluidly connected to coolant loop inlet pipe 150*a* (of FIGS. 2A and 2B) at inlet port 350*a* and to coolant loop outlet pipe 150*b* (of FIGS. 2A and 2B) at outlet port 350*b*. Thermal plate 300 is preferably made of aluminum, although other suitable thermally conductive materials could be used. Each phase of one or more DC-to-AC power conversion bridges (for example, comprising insulated gate bipolar transistors (IGBTs), and diodes) can be mounted directly to a thermal plate. Thermal plate 300 comprises internal flow channels through which the coolant is directed. For example, one or more serpentine channels can be used. The channels can be configured and/or the electronic hardware can be mounted on thermal plate 300 such that cooling is targeted in the regions where it is needed the most.

In other embodiments, the second liquid cooling loop 150 is configured to direct coolant directly through the power electronics equipment.

FIGS. 4-9 show various views of a 2 MW solar inverter enclosure 400 into which the cooling system shown in FIGS. 2A and 2B can be installed. Enclosure 400 has several access panels or doors allowing access to separate compartments which house different sub-systems within enclosure 400. Like numerals are used to indicate the same or similar components throughout the different views shown in FIGS. 4-9. Solar inverter enclosure 400 can be constructed of aluminum, for good corrosion-resistance. The enclosure can be constructed by assembling a number of separate panels, with gaskets and bolted connections there between.

Figure 4:
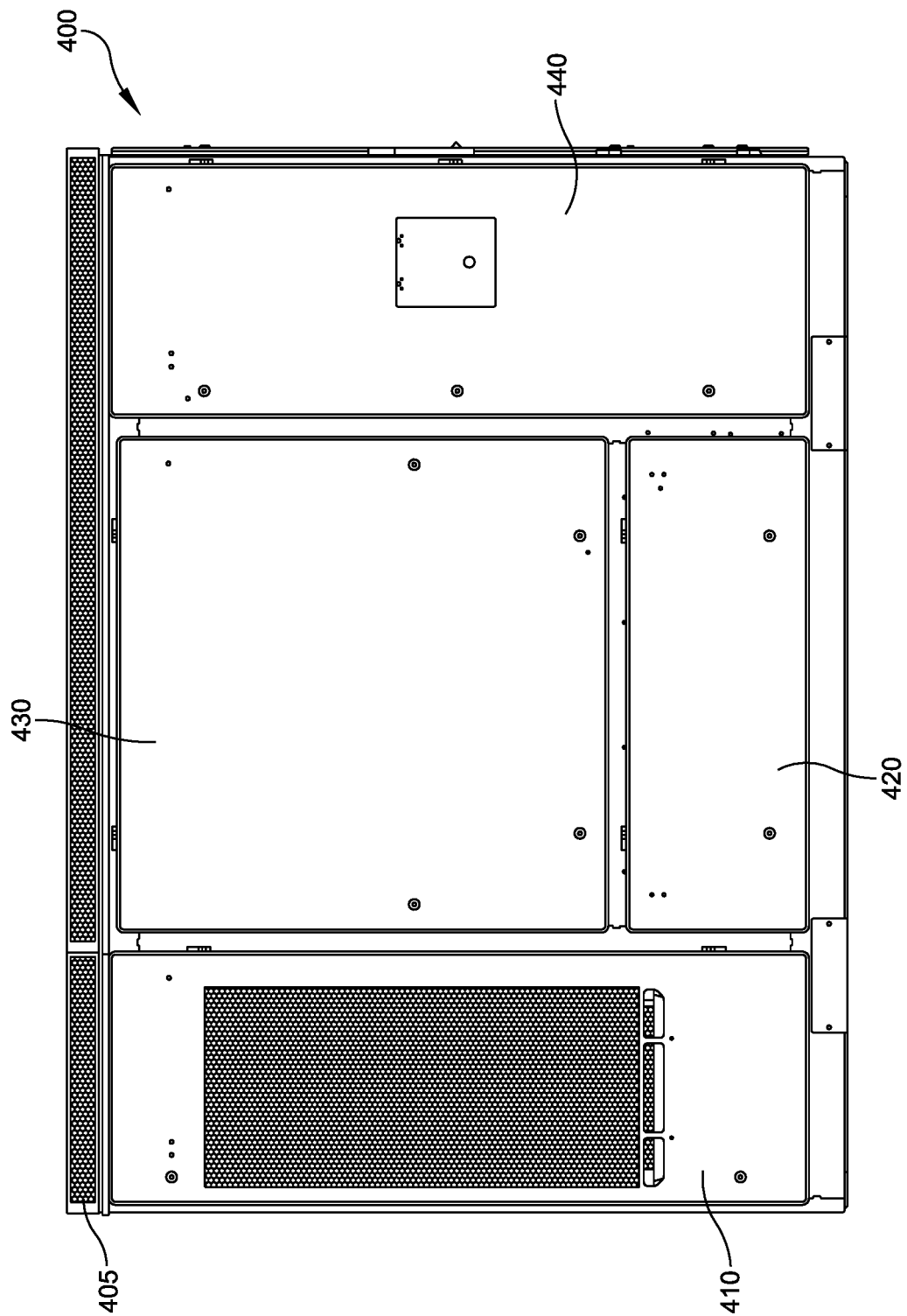
FIG. 4 is a front view of an inverter enclosure in accordance with principles of the invention.
Figure 5:
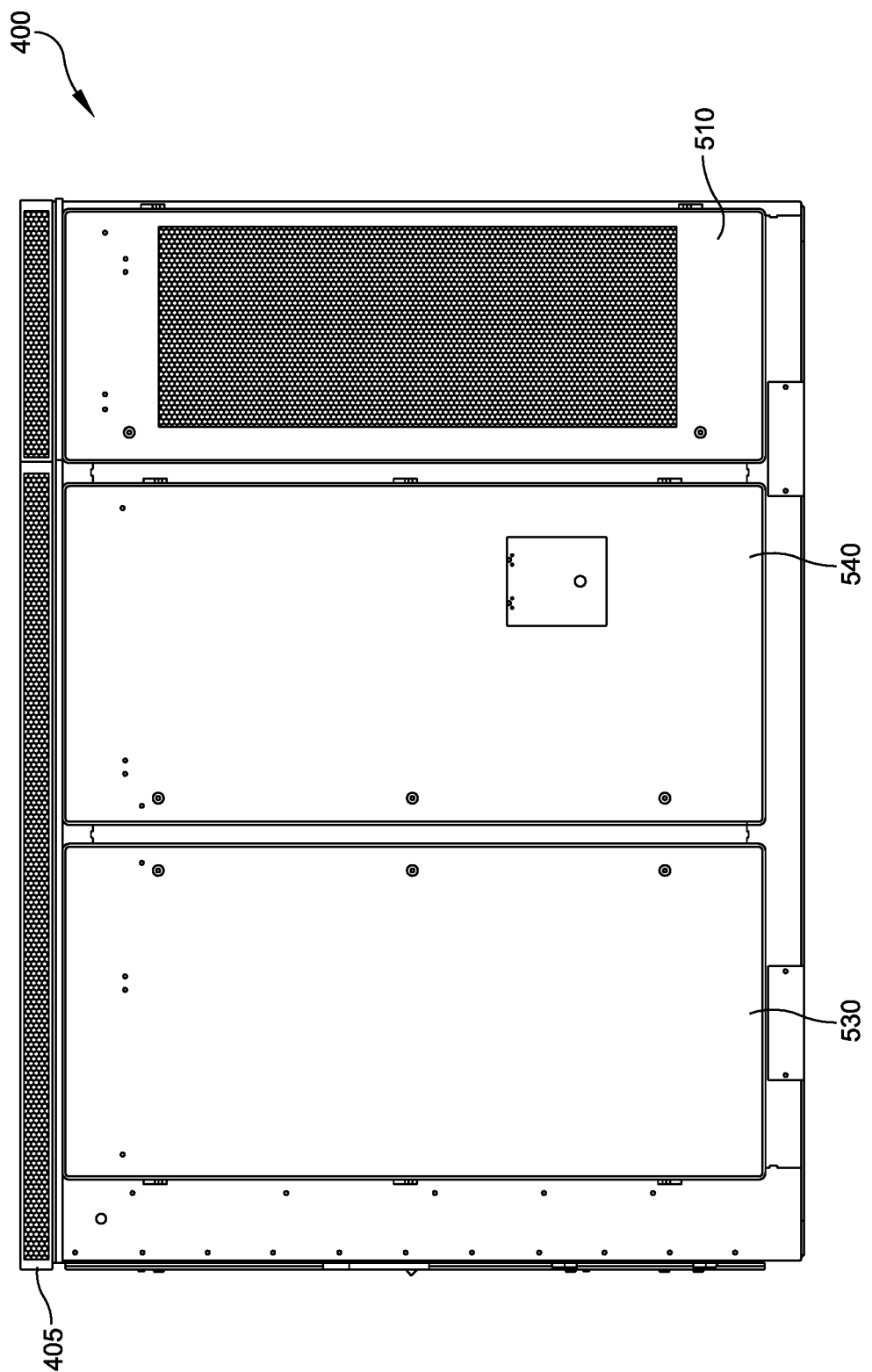
FIG. 5 is a rear view of an inverter enclosure in accordance with principles of the invention.
Figure 7:
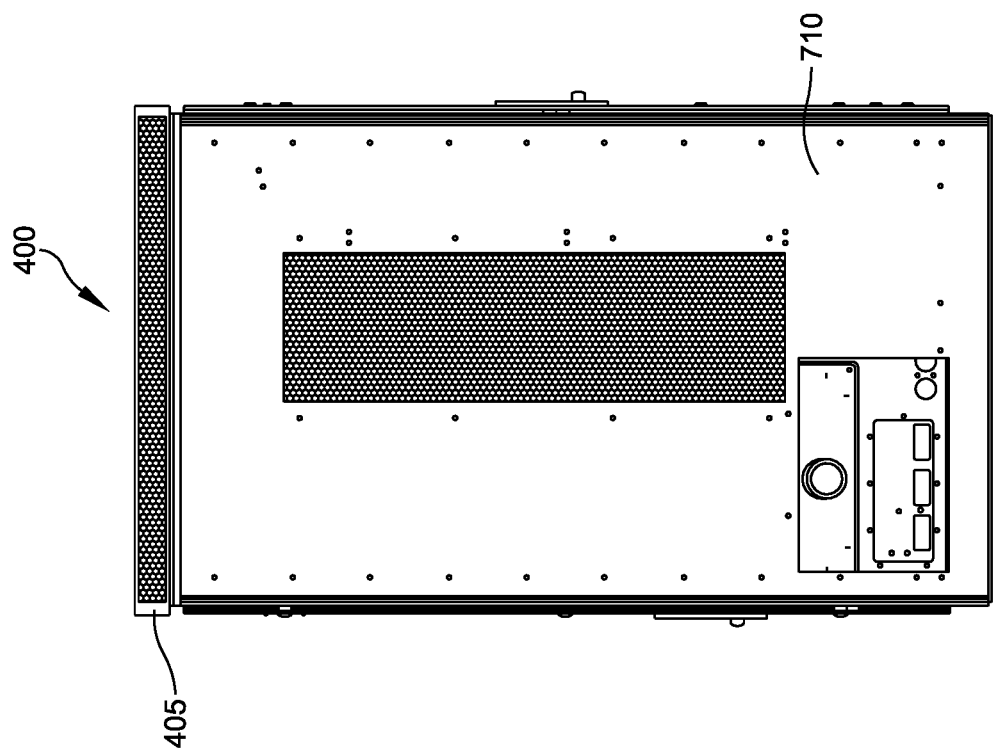
FIG. 7 is a left side view of an inverter enclosure in accordance with principles of the invention.
Figure 6:
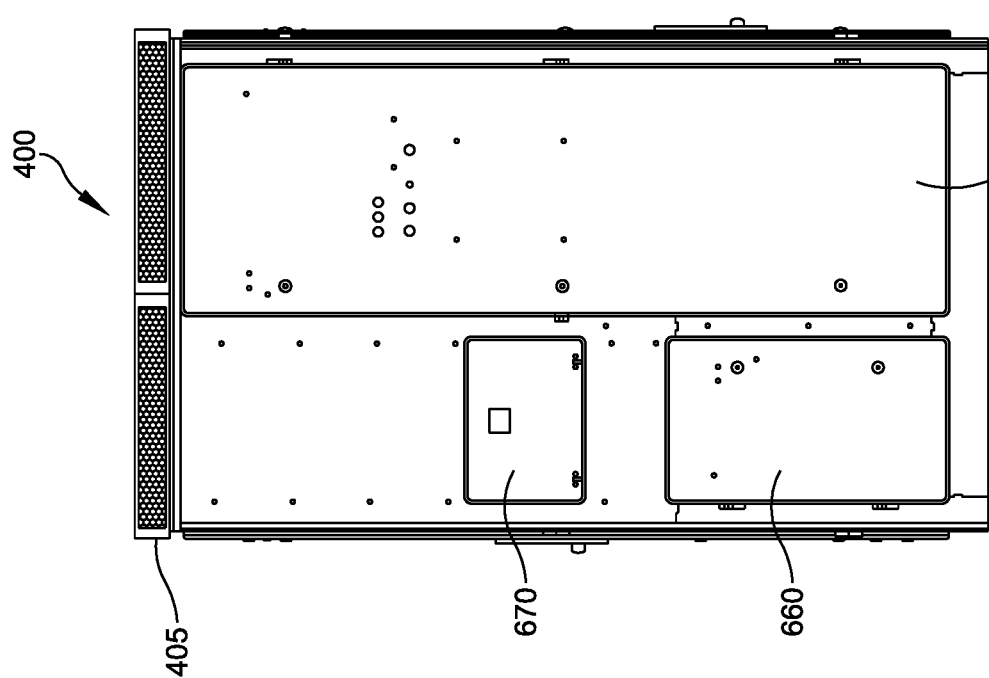
FIG. 6 is a right side view of an inverter enclosure in accordance with principles of the invention.

FIG. 4 is a front view of solar inverter enclosure 400, showing vented roof panel assembly 405, cooling cabinet access panel 410, DC cabling compartment access panel 420, and electronics compartment access panels 430 and 440. FIG. 5 is a rear view of solar inverter enclosure 400, showing vented roof panel 505, vented cooling cabinet access panel 510, and electronics compartment access panels 530 and 540. FIG. 6 is a right-side view of solar inverter enclosure 400, showing communication compartment access panel 650, communication wiring compartment access panel 660, and display cover/laptop tray 670. FIG. 7 is a left-side view of solar inverter enclosure 400, showing vented cooling cabinet end wall 710.

Figure 8:
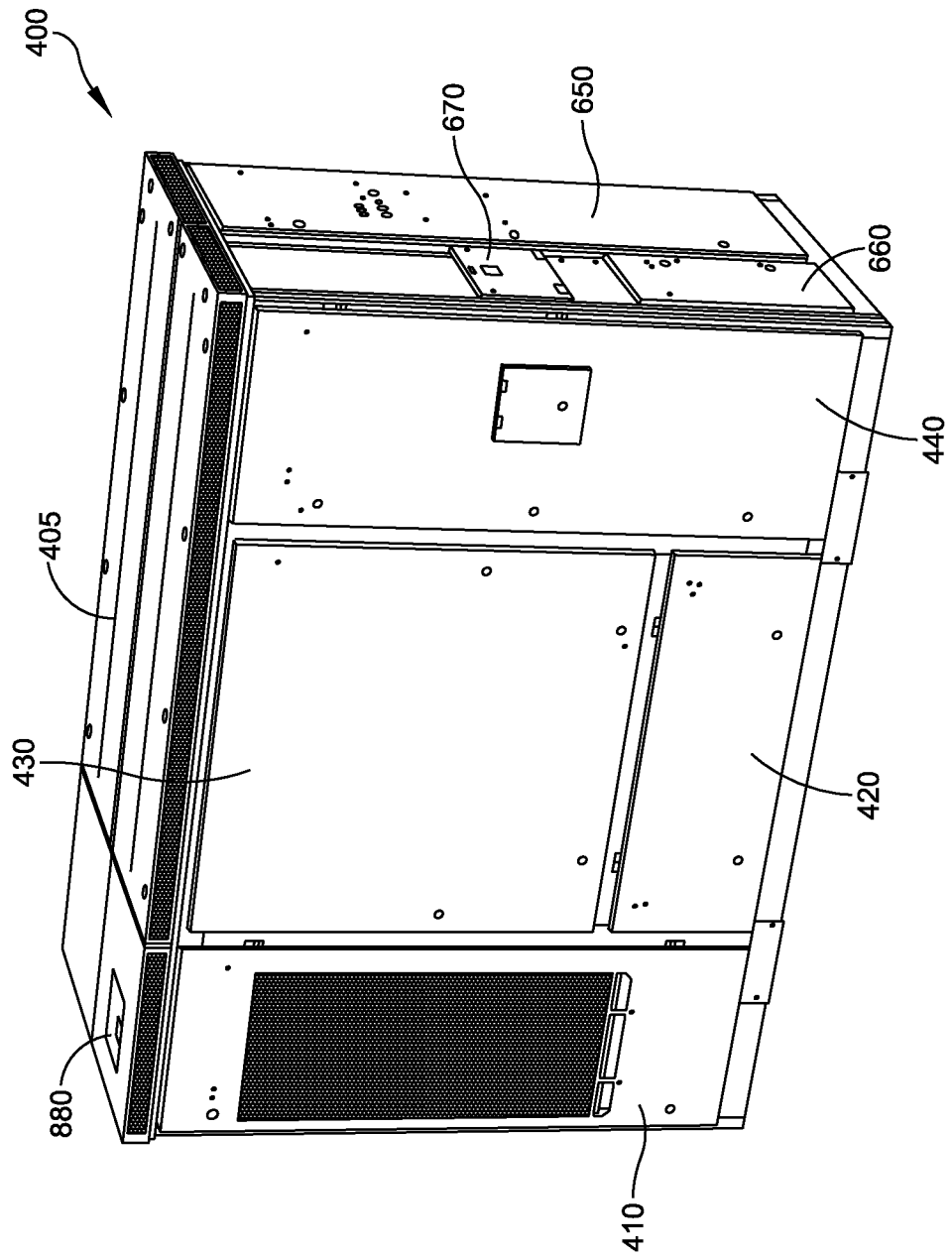
FIG. 8 is a front/topside isometric view of an inverter enclosure in accordance with principles of the invention.
Figure 9:
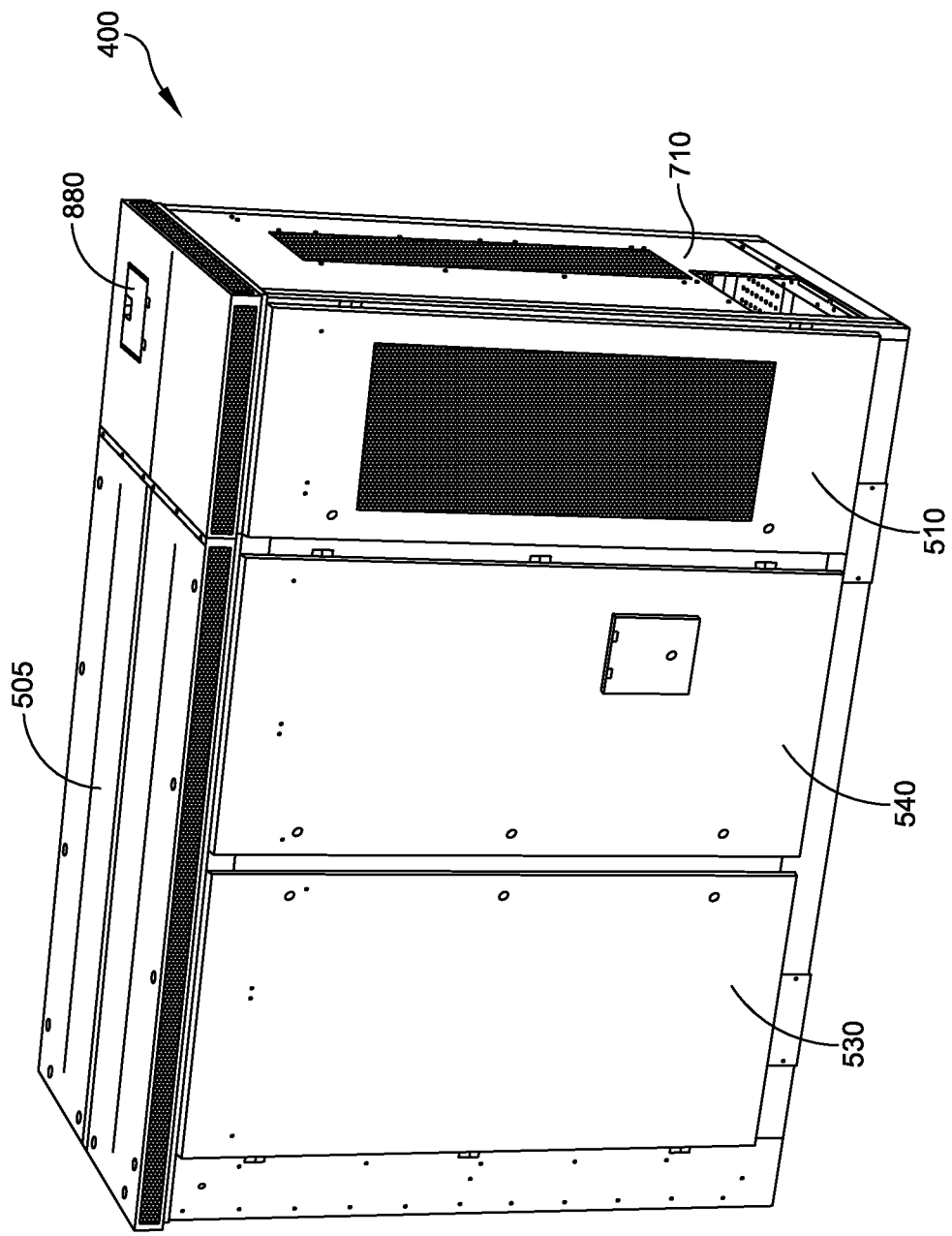
FIG. 9 is a rear/topside isometric view of an inverter enclosure in accordance with principles of the invention.

FIGS. 8 and 9 are front/topside and rear/topside isometric views of solar inverter enclosure 400, showing the various access panels as described above. Coolant reservoir access hatch 880 is visible in FIGS. 8 and 9.

Figure 10:
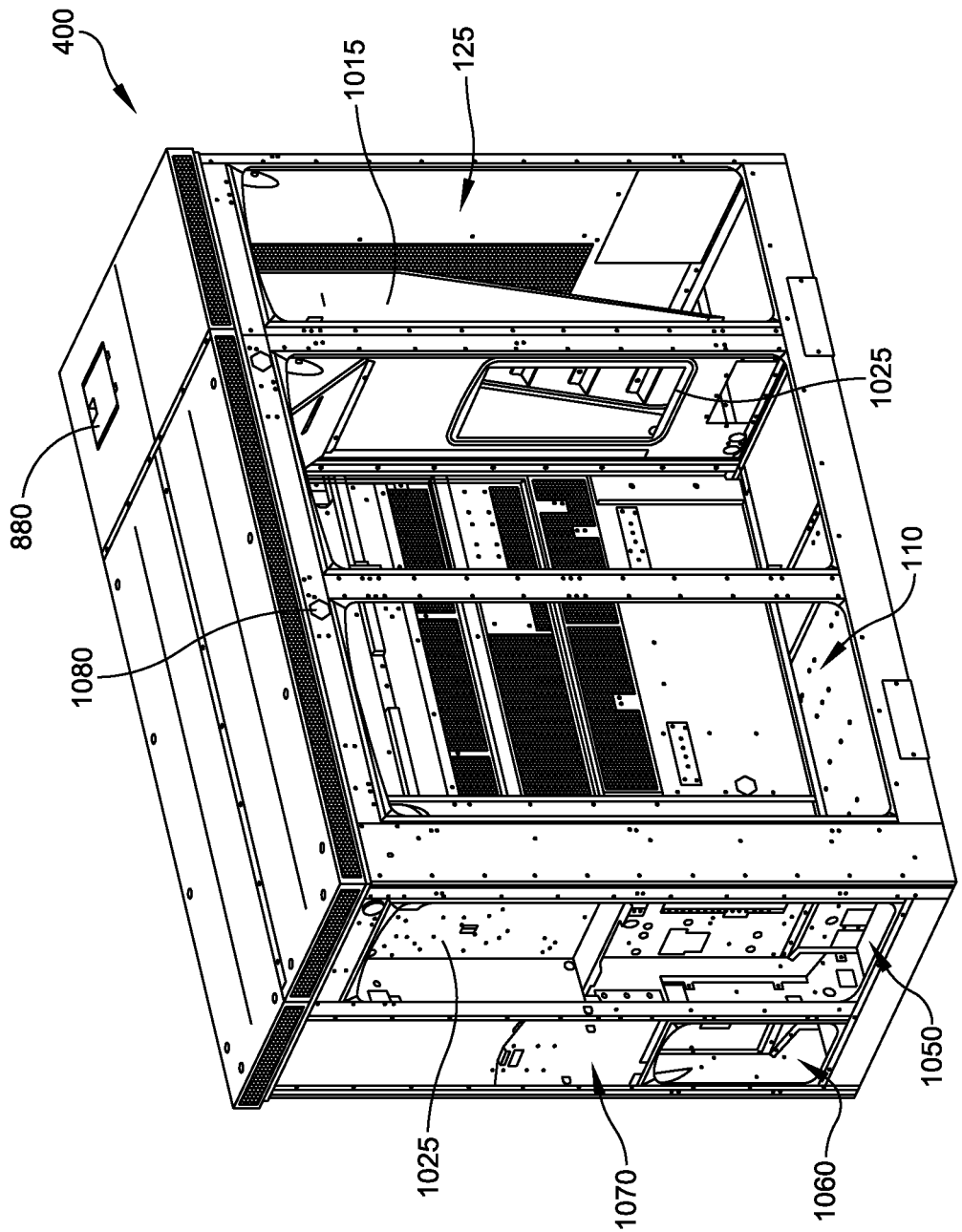
FIG. 10 is a front/topside interior isometric view of an inverter enclosure in accordance with principles of the invention.
Figure 11:
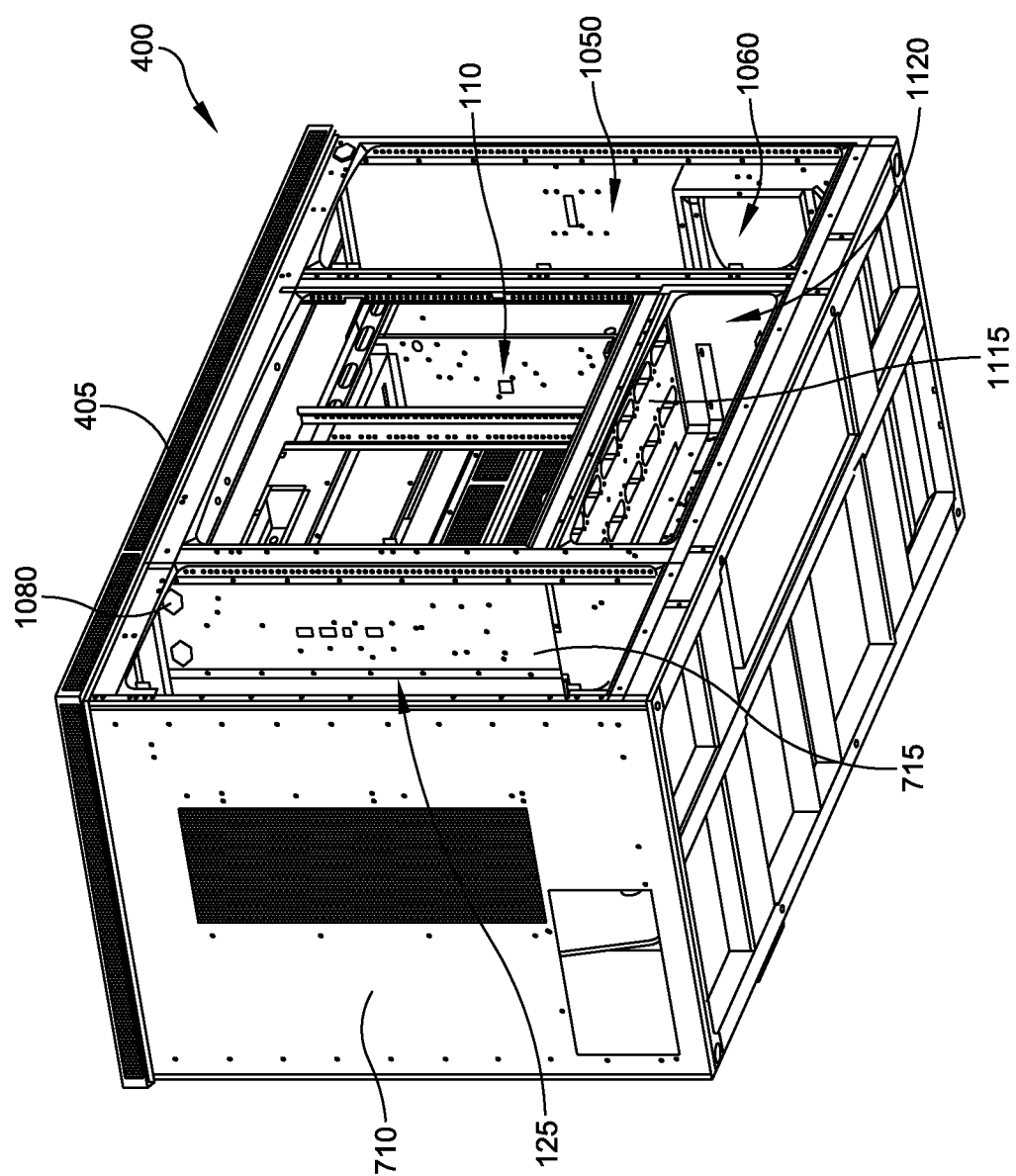
FIG. 11 is a rear/topside interior isometric view of an inverter enclosure in accordance with principles of the invention.

The same reference numerals as were used in FIG. 1 and FIGS. 2A and 2B are used to identify like components in FIGS. 10-11.

FIG. 10 is a rear/topside isometric view of solar inverter enclosure 400 with the access panels removed to reveal various interior compartments that house different sub-systems within enclosure 400. FIG. 10 shows cooling cabinet 125 separated from electronics compartment 110 by interior panel 1015 which forms part of the internal duct (160 in FIG. 1) through which air is circulated in compartment 110 by fan 138 (shown in FIGS. 1, 2A and 2B). Opening 1025 accommodates a heat exchanger (such as heat exchanger 132 of FIGS. 1, 2A and 2B). Communication and auxiliary power compartment 1050 is separated from electronics compartment 110 by interior panel 1025. Communication wiring compartment 1060, and display box 1070 are shown and are defined by interior panels (not labelled).

FIG. 11 is a front/underside isometric view of solar inverter enclosure 400, also with the access panels removed to reveal various interior compartments, 110, 1010, 1050 and 1060 as described in reference to FIG. 10 above. FIG. 11 also shows DC cabling compartment 1120, which is separated from electronics compartment 1030 by interior panel 1115, and the cooling cabinet 125, which is separated from the sealed electronics compartment 110 and the compartment 1120 by interior panel 715.

In the assembled solar inverter product, electronics compartment 110 is substantially sealed to prevent ingress of water or dust into this compartment—it is rated NEMA Type 4 or IP65. Seals are used around the access panels to this compartment. Cooling cabinet 125 is vented or "open-to-environment", and houses most of the cooling system shown in FIGS. 1, 2A and 2B (including stacked heat exchangers 136 and 156, pumps 134 and 154, fans 140*a* and 140*b*). Sealed liquid pass-throughs into the electronics compartment 110 are used. This allows much of the liquid cooling system to be located outside electronics compartment 110. DC cabling compartment 1120 has sealed high power bus pass-throughs into sealed electronics compartment 110. This allows DC field wiring to be completed without exposing the sealed electronics compartment to the environment during installation.

Communication and auxiliary power compartment 1050 and communication wiring compartment 1060 will be accessed more frequently by the operator, and therefore these components are separated from sealed electronics compartment 110. Communications and low voltage connections enter the solar inverter system via these sections, so that the main electronics compartment 110 is not exposed during installation, commissioning or some service operations.

Seven protective screw-in passive vents (Gore Polyvent XL devices), such as shown at 1080, are installed in the wall panels that define electronics compartment 110 as shown in FIGS. 10 and 11. These vents consist of a passive water vapor transport membrane and provide passive pressure equalization and humidity control within the compartment 110, as described above.

Various temperature sensors and other sensors are used by a control system to control operation of the thermal management system, including operation of pumps and fans (not shown in here). In some embodiments the dual-loop thermal management system is operated to maintain the air temperature within the electronics compartment at a certain temperature (e.g., 50° C.) or within a certain temperature range during operation of the solar inverter system; and, if the cooling system is unable to maintain the air temperature within the electronics compartment below a first threshold (say 50° C.), the controller 145 may limit (de-rate) the power output of the inverter to reduce the amount of heat being generated in order to try to maintain the temperature below the first threshold. If the air temperature within the electronics compartment exceeds a second threshold (the same or higher than the first threshold) the controller 145 may shut down the solar inverter.

Controller 145 of the inverter system 900 may include, for example, a general-purpose computer such as those based on Intel PENTIUM-type processor, Motorola PowerPC, Sun UltraSPARC, Hewlett-Packard PA-RISC processors, or any other type of processor.

Figure 12:
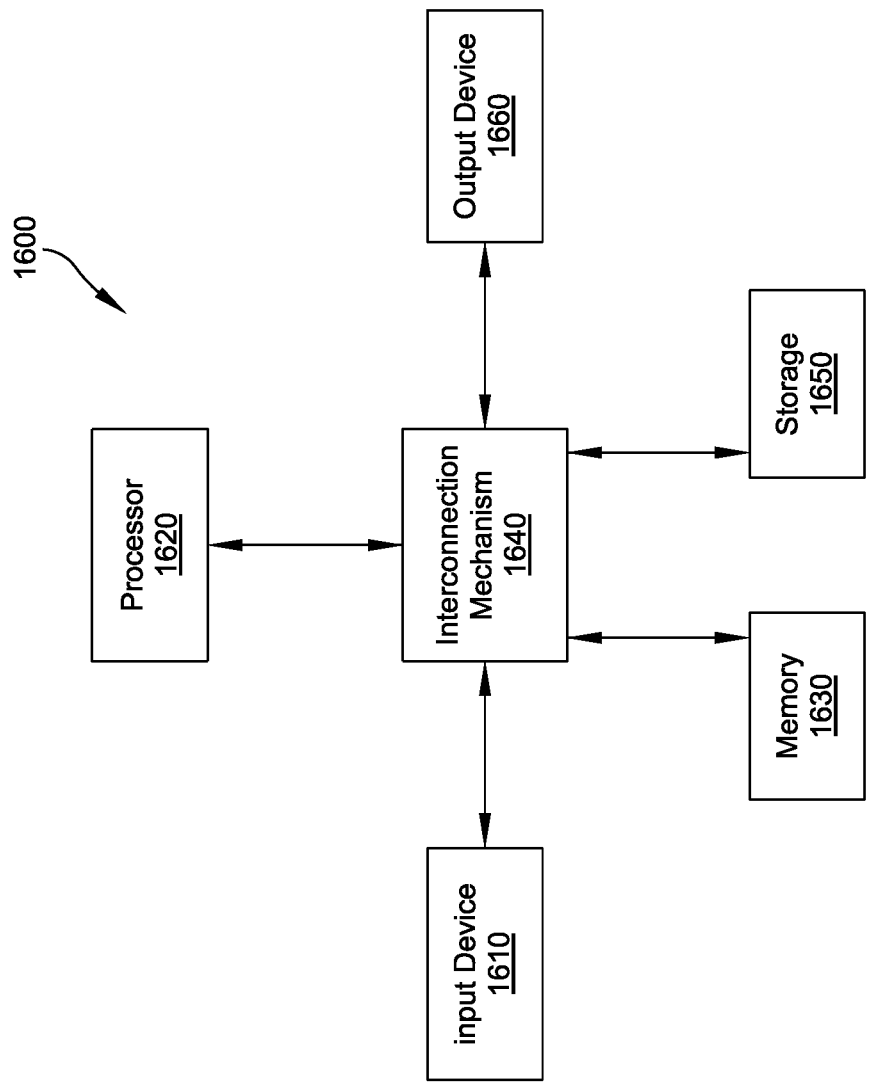
FIG. 12 is a schematic diagram of a controller used in connection with embodiments of the invention.

For example, the methods employed in the controller in various embodiments of the invention may be implemented as specialized software executing in a general-purpose computer system 1600 such as that shown in FIG. 12. The system 1600 may include a processor 1620 connected to one or more memory devices 1630, such as a disk drive, memory, or other device for storing data. Memory 1630 is typically used for storing programs and data during operation of the system 1600. The system 1600 may also include a storage system 1650 that provides additional storage capacity. Components of system 1600 may be coupled by an interconnection mechanism 1640, which may include one or more busses (e.g., between components that are integrated within the same machine) and/or a network (e.g., between components that reside on separate discrete machines). The interconnection mechanism 1640 enables communications (e.g., data, instructions) to be exchanged between system components of system 1600.

System 1600 also includes one or more input devices 1610, for example, a keyboard, mouse, trackball, microphone, touch screen, and one or more output devices 1660, for example, a printing device, display screen, speaker. In addition, computer system 1600 may contain one or more interfaces (not shown) that connect system 1600 to a communication network (in addition or as an alternative to the interconnection mechanism 1640).

Figure 13:
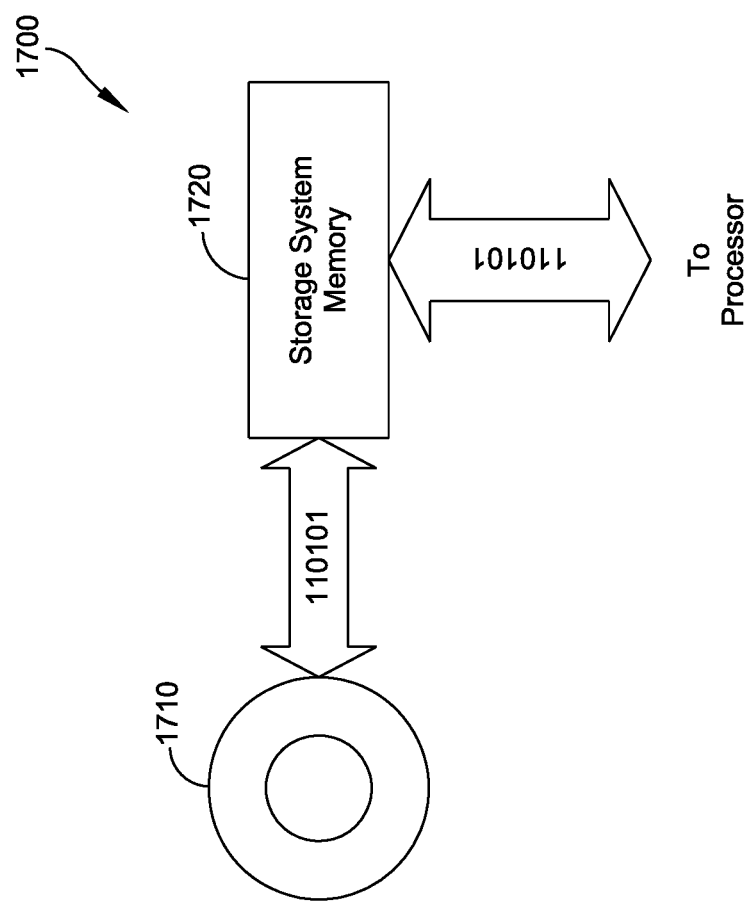
FIG. 13 is a storage system used in connection with FIG. 12.

The storage system 1650, shown in greater detail in FIG. 13, typically includes a computer readable and writeable nonvolatile recording medium 1700 in which signals are stored that define a program to be executed by the processor or information stored on or in the medium 1700 to be processed by the program to perform one or more functions associated with embodiments described herein. The medium may, for example, be a disk or flash memory. Typically, in operation, the processor causes data to be read from the nonvolatile recording medium 1700 into another memory 1710 that allows for faster access to the information by the processor than does the medium 1700. This memory 1710 is typically a volatile, random access memory such as a dynamic random access memory (DRAM) or static memory (SRAM). It may be located in storage system 1706, as shown, or in memory system 1630. The processor 1620 generally manipulates the data within the integrated circuit memory 1630, 1710 and then copies the data to the medium 1700 after processing is completed. A variety of mechanisms are known for managing data movement between the medium 1700 and the integrated circuit memory element 1630, 1710, and the invention is not limited thereto. The invention is not limited to a particular memory system 1630 or storage system 1650.

The computer system may include specially-programmed, special-purpose hardware, for example, an application-specific integrated circuit (ASIC). Aspects of the invention may be implemented in software, hardware or firmware, or any combination thereof. Further, such methods, acts, systems, system elements and components thereof may be implemented as part of the computer system described above or as an independent component.

Although computer system 1600 is shown by way of example as one type of computer system upon which various aspects of the invention may be practiced, it should be appreciated that aspects of the invention are not limited to being implemented on the computer system as shown in FIG. 5. Various aspects of the invention may be practiced on one or more computers having a different architecture or components shown in FIG. 5. Further, where functions or processes of embodiments of the invention are described herein (or in the claims) as being performed on a processor or controller, such description is intended to include systems that use more than one processor or controller to perform the functions.

Computer system 1600 may be a general-purpose computer system that is programmable using a high-level computer programming language. Computer system 1600 may be also implemented using specially programmed, special purpose hardware. In computer system 1600, processor 1620 is typically a commercially available processor such as the well-known Pentium class processor available from the Intel Corporation. Many other processors are available. Such a processor usually executes an operating system which may be, for example, the Windows 95, Windows 98, Windows NT, Windows 2000 (Windows ME) or Windows XP or Vista operating systems available from the Microsoft Corporation, MAC OS System X operating system available from Apple Computer, the Solaris operating system available from Sun Microsystems, or UNIX operating systems available from various sources. Many other operating systems may be used.

The processor and operating system together define a computer platform for which application programs in high-level programming languages are written. It should be understood that embodiments of the invention are not limited to a particular computer system platform, processor, operating system, or network. In addition, it should be apparent to those skilled in the art that the present invention is not limited to a specific programming language or computer system. Further, it should be appreciated that other appropriate programming languages and other appropriate computer systems could also be used.

One or more portions of the computer system may be distributed across one or more computer systems coupled to a communications network. For example, as discussed above, a computer system that determines available power capacity may be located remotely from a system manager. These computer systems also may be general-purpose computer systems. For example, various aspects of the invention may be distributed among one or more computer systems configured to provide a service (e.g., servers) to one or more client computers, or to perform an overall task as part of a distributed system. For example, various aspects of the invention may be performed on a client-server or multi-tier system that includes components distributed among one or more server systems that perform various functions according to various embodiments of the invention. These components may be executable, intermediate (e.g., IL) or interpreted (e.g., Java) code which communicate over a communication network (e.g., the Internet) using a communication protocol (e.g., TCP/IP). For example, one or more database servers may be used to store device data, such as expected power draw, that is used in designing layouts associated with embodiments of the present invention.

It should be appreciated that the invention is not limited to executing on any particular system or group of systems. In addition, it should be appreciated that the invention is not limited to any particular distributed architecture, network, or communication protocol.

Various embodiments of the present invention may be programmed using an object-oriented programming language, such as SmallTalk, Java, C++, Ada, or C# (C-Sharp). Other object-oriented programming languages may also be used. Alternatively, functional, scripting, and/or logical programming languages may be used. Various aspects of the invention may be implemented in a non-programmed environment (e.g., documents created in HTML, XML or other format that, when viewed in a window of a browser program render aspects of a graphical-user interface (GUI) or perform other functions). Various aspects of the invention may be implemented as programmed or non-programmed elements, or any combination thereof.

In embodiments of the present invention discussed above, results of analyses are described as being provided in real-time. As understood by those skilled in the art, the use of the term real-time is not meant to suggest that the results are available immediately, but rather, are available quickly giving a designer the ability to try a number of different designs over a short period of time, such as a matter of minutes.

Having thus described several aspects of at least one embodiment of this invention in considerable detail with reference to certain preferred version thereof, it is to be appreciated various alterations, modifications, and improvements will readily occur to those skilled in the art. Such alterations, modifications, and improvements are intended to be part of this disclosure and are intended to be within the spirit and scope of the invention. Accordingly, the foregoing description and drawings are by way of example only. Further, the phraseology and terminology used herein is for the purpose of descriptions and should not be regarded as limiting. The use of "including," "comprising," "having," "containing," "involving," and variations herein, are meant to be open-ended, i.e., "including but not limited to."

What is claimed is:

1. A power electronics system, comprising:
   a first liquid cooling loop configured to cool air flowing through an environmentally sealed electronics compartment, the first liquid cooling loop being situated partially within the sealed electronics compartment and partially outside the sealed electronics compartment;
   a second liquid cooling loop configured to directly cool power electronics equipment, the second liquid cooling loop being fluidically separate from the first liquid cooling loop, the second liquid cooling loop being situated partially within the sealed electronics compartment and partially outside the sealed electronics compartment;
   a first heat exchanger coupled to the first liquid cooling loop, the first heat exchanger being situated outside the sealed electronics compartment;
   a second heat exchanger coupled to the second liquid cooling loop, the second heat exchanger being situated outside the sealed electronics compartment;
   a third heat exchanger mounted in an interior side wall of the environmentally sealed electronics compartment and configured to permit air to transfer into a first interior area on one side of the interior side wall from a second interior area on another side of the interior side wall, the third heat exchanger being further mounted below a horizontal compartment, the horizontal compartment adjoining the first interior area and the second interior area and configured to permit air into the second interior area, above the third heat exchanger, from the first interior area;
   at least one first fan coupled to the first heat exchanger and configured to draw external air from an external location and provide the external air to the first heat exchanger, the at least one first fan being situated outside the sealed electronics compartment; and
   at least one second fan coupled to the second heat exchanger and configured to draw air from the first heat exchanger, the air being derived from the external air, and provide the air to the second heat exchanger, the at least one second fan being situated outside the sealed electronics compartment.

2. The system of claim 1, wherein the power electronics equipment includes an inverter.

3. The system of claim 1, wherein the first liquid cooling loop includes a plurality of heat exchangers and at least one fan for circulating air through a plenum provided within the environmentally sealed electronics compartment.

4. The system of claim 1, further comprising a controller for independently controlling airflow rates and coolant flow rates of the first liquid cooling loop and the second liquid cooling loop, wherein the controller is programmed to analyze environmental data to control air and coolant flow rates of the first and second liquid cooling loops to maintain a pre-set temperature within the environmentally sealed electronics compartment.

5. The system of claim 1, wherein the first liquid cooling loop includes the first heat exchanger, the third heat exchanger, and a pump to circulate a liquid coolant in the first liquid cooling loop.

6. The system of claim 5, further comprising a fan to circulate air within the environmentally sealed electronics compartment, the fan being configured to blow air through the third heat exchanger, the third heat exchanger being situated within the environmentally sealed electronics compartment.

7. The system of claim 1, further comprising:
   an internal temperature sensor configured to obtain temperature information within the environmentally sealed electronics compartment; and
   an external temperature sensor configured to obtain temperature information outside the environmentally sealed electronics compartment.

8. The system of claim 1, wherein the second liquid cooling loop includes a pump to circulate liquid coolant in the second liquid cooling loop.

9. The system of claim 8, wherein the second liquid cooling loop is configured to direct coolant through the power electronics equipment or through a device associated with the power electronics equipment.

10. The system of claim 9, wherein coolant in the second liquid cooling loop is configured to flow through channels inside a thermal plate to which a power conversion bridge is mounted.

11. The system of claim 9, wherein coolant in the second liquid cooling loop further is configured to flow through multiple thermal plates in contact with filter electronics and associated magnetic components.

12. The system of claim 9, wherein coolant in the second liquid cooling loop is configured to flow adjacent to electronic switches.

13. The power electronics system of claim 1 further comprising at least one heater mounted in the horizontal compartment.

14. A method of thermal control in a power electronics system, comprising:
   controlling the flow rate of a first liquid cooling loop within a sealed electronics compartment to cool air flowing through the environmentally sealed electronics compartment, wherein the first liquid cooling loop is situated partially within and partially outside the environmentally sealed electronics compartment;
   controlling the flow rate of a second liquid cooling loop configured to directly cool power electronics equipment, the second liquid cooling loop being fluidically separate from the first liquid cooling loop, wherein the second liquid cooling loop is situated partially within and partially outside the environmentally sealed electronics compartment;
   providing external air via at least one first fan to a first heat exchanger, the first heat exchanger being coupled to the first liquid cooling loop, the first heat exchanger and at least one first fan being situated outside the environmentally sealed electronics compartment;

providing air via at least one second fan to a second heat exchanger, the second heat exchanger being coupled to the second liquid cooling loop and the air being drawn from the first heat exchanger, the second heat exchanger and the at least one second fan being situated outside the environmentally sealed electronics compartment; and providing air to a third heat exchanger mounted in an interior side wall of the environmentally sealed electronics compartment, the third heat exchanger being configured to permit air to transfer into a first interior area on one side of the interior side wall from a second interior area on another side of the interior side wall, the third heat exchanger being further mounted below a horizontal compartment, the horizontal compartment adjoining the first interior area and the second interior area and configured to permit air into the second interior area, above the third heat exchanger, from the first interior area.

15. The method of claim 14, further comprising circulating air within the environmentally sealed electronics compartment and blowing air through the third heat exchanger.

16. The method of claim 14, wherein the first liquid cooling loop includes a plurality of heat exchangers and at least one third fan for circulating air through a plenum provided within the environmentally sealed electronics compartment.

17. The method of claim 14, further comprising analyzing environmental data, and controlling flow rates of the first and second liquid cooling loops to maintain a pre-set temperature within the environmentally sealed electronics compartment.

18. The method of claim 14, wherein the second liquid cooling loop is configured to direct coolant through the power electronics equipment or through a device associated with the power electronics equipment.

19. The method of claim 18, wherein coolant in the second liquid cooling loop is configured to flow through channels inside a thermal plate to which a power conversion bridge is mounted.

20. The method of claim 18, wherein coolant in the second liquid cooling loop further is configured to flow through multiple thermal plates in contact with filter electronics and associated magnetic components.

21. The method of claim 18, wherein coolant in the second liquid cooling loop is configured to flow adjacent to electronic switches.

22. The method of claim 14 further comprising heating air in the horizontal compartment using at least one heater.

23. The method of claim 22 wherein the air is heated in the horizontal compartment during a start-up cycle of a solar inverter system coupled to the power electronics system.

* * * * *